United States Patent
Park

(10) Patent No.: US 12,043,917 B2
(45) Date of Patent: Jul. 23, 2024

(54) SINGLE CRYSTAL INGOT GROWTH CONTROL DEVICE

(71) Applicant: SK SILTRON CO., LTD., Gumi-si (KR)

(72) Inventor: Hyun Woo Park, Gumi-si (KR)

(73) Assignee: SK SILTRON CO., LTD., Gumi-si (KR)

(*) Notice: Subject to any disclaimer, the term of this patent is extended or adjusted under 35 U.S.C. 154(b) by 326 days.

(21) Appl. No.: 17/424,098

(22) PCT Filed: Jan. 20, 2020

(86) PCT No.: PCT/KR2020/000962
§ 371 (c)(1),
(2) Date: Jul. 19, 2021

(87) PCT Pub. No.: WO2020/153689
PCT Pub. Date: Jul. 30, 2020

(65) Prior Publication Data
US 2022/0127749 A1    Apr. 28, 2022

(30) Foreign Application Priority Data
Jan. 25, 2019   (KR) .................. 10-2019-0009929

(51) Int. Cl.
*C30B 15/00*        (2006.01)
*C30B 15/22*        (2006.01)
(Continued)

(52) U.S. Cl.
CPC .............. *C30B 15/22* (2013.01); *C30B 29/06* (2013.01); *G05B 6/02* (2013.01)

(58) Field of Classification Search
CPC ............ C30B 15/22; C30B 29/06; G05B 6/02
(Continued)

(56) References Cited

U.S. PATENT DOCUMENTS

| 2006/0130737 A1* | 6/2006 | Wakabayashi .......... C30B 15/22 |
| | | 117/14 |
| 2010/0206219 A1* | 8/2010 | Orschel .................. C30B 29/06 |
| | | 117/202 |

FOREIGN PATENT DOCUMENTS

| JP | 2000-335996 A | 12/2000 |
| JP | 2007-45685 A | 2/2007 |

(Continued)

OTHER PUBLICATIONS

Office Action for Chinese Application No. 202080010968.6 dated Mar. 25, 2023, 7 pages.

(Continued)

*Primary Examiner* — Tiffany P Young
(74) *Attorney, Agent, or Firm* — Lewis Roca Rothgerber Christie LLP

(57) ABSTRACT

A single crystal ingot growth control device includes: an input unit that receives a diameter error that is a difference value between a measured diameter of the ingot and a target diameter; a calculation unit that performs integral calculation on the diameter error received by the input unit in real time and calculates a final pulling speed for each set time that is increased stepwise by reflecting the diameter error integral value, and an output unit that outputs the final pulling speed calculated by the calculation unit to a pulling controller during the set time.

8 Claims, 7 Drawing Sheets

(51) Int. Cl.
*C30B 29/06* (2006.01)
*G05B 6/02* (2006.01)

(58) Field of Classification Search
USPC ........................................... 700/274
See application file for complete search history.

(56) References Cited

FOREIGN PATENT DOCUMENTS

| | | |
|---|---|---|
| JP | 4414504 B2 | 2/2010 |
| JP | 2010-53015 A | 3/2010 |
| JP | 2010-195610 A | 9/2010 |
| KR | 2003-0020474 A | 3/2003 |
| KR | 10-2014-0095329 A | 8/2014 |
| KR | 10-1623644 B1 | 5/2016 |
| WO | WO 2018/105827 A1 | 6/2018 |

OTHER PUBLICATIONS

International Search Report of PCT/KR2020/000962, dated Jun. 12, 2020, 4 pages.

* cited by examiner

SINGLE CRYSTAL INGOT GROWTH CONTROL DEVICE

CROSS-REFERENCE TO RELATED APPLICATION(S)

This application is a U.S. National Phase Patent Application of PCT/KR2020/000962, filed Jan. 20, 2020, which claims priority to Korean patent application 10-2019-0009929, filed on Jan. 25, 2019, the entire content of each of which is hereby incorporated by reference.

TECHNICAL FIELD

The present invention relates to a single crystal ingot growth control device capable of accurately controlling a diameter of an ingot even when a shouldering process is switched to a body process.

BACKGROUND ART

In general, a single crystal ingot that is used as a material for producing an electronic component such as semiconductors is fabricated by a Czochralski (hereinafter referred to as CZ) method.

A process of growing a single crystal ingot by using the CZ method includes a necking process that grows a seed crystal at a rapid pulling speed after dipping a seed into a melt obtained by melting polycrystalline silicon, a shouldering process that gradually grows a single crystal in the radial direction with the seed so as to have a diameter of a predetermined size, a body process that grows by a predetermined length so as to maintain a body diameter of a predetermined size, and a tailing process that separates the single crystal from the melt while reducing the diameter of the body.

Japanese Laid-open Patent Publication No. 2010-195610 (filed on Feb. 23, 2009) discloses a method of manufacturing a single crystal for controlling a diameter of the single crystal, and the diameter of the single crystal is controlled by calculating upper and lower limit values of a manipulated amount of a pulling speed of the single crystal in a process of pulling the single crystal and repeating a process of controlling a moving average value of the pulling speed of the single crystal by comparing the calculated values with a set value.

According to the above technology, it is possible to uniformly control the diameter of the single crystal during the body process.

However, while the single crystal grows laterally in the shouldering process, the single crystal grows vertically in the body process, and thus there is a strong tendency for the single crystal to grow laterally in the shouldering process at the beginning of the body process, and accordingly, there is a limit to accurately controlling the diameter even when it is controlled as in the related art.

FIGS. 1A and 1B are diagrams illustrating a growth state of a single crystal ingot at the beginning of a body process according to the related art.

According to the related art, as shown in [Table 1], a target diameter ($D_0$) may be controlled by changing a pulling speed (P/S) of the ingot according to a diameter error ($\Delta D$) of the ingot at the beginning of the body process.

TABLE 1

| Diameter error ($\Delta D$, mm) | Time (t, sec) | Pulling speed (P/S, mm/min) |
| --- | --- | --- |
| 3 | 60 | 2.5 |
| 2 | 30 | 1.5 |
| 1 | 10 | 1.0 |
| −1 | 10 | 0.7 |
| −2 | 30 | 0.5 |
| −3 | 60 | 0.3 |

When the pulling speed (P/S) of the ingot is controlled as it is at the beginning of the body process, the ingot is grown as a single crystal having a diameter ($D_1$) larger than the target diameter ($D_0$) as shown in FIG. 1A. When the pulling speed (P/S) of the ingot is rapidly controlled at the beginning of the body process, the ingot is grown as a single crystal having a diameter ($D_2$) smaller than the target diameter ($D_0$) as shown in FIG. 1B.

FIG. 2 is a flowchart illustrating an example of a method of manufacturing the single crystal ingot according to the related art, and FIG. 3 is a graph illustrating a diameter error for each length of the single crystal ingot according to the related art.

According to the method of manufacturing the single crystal ingot according to the related art, when a diameter (D) of the ingot grows rapidly at the beginning of the body process, as shown in FIG. 2, a pulling speed (P/S) of the ingot is controlled to strongly increase in order to decrease the diameter (D) of the ingot, and when the pulling speed (P/S) of the ingot increases strongly, the diameter of the ingot (D) decreases rapidly (see S1, S2, and S3).

In addition, when the diameter (D) of the ingot decreases rapidly, the pulling speed (P/S) of the ingot is controlled to decrease strongly in order to increase the diameter (D) of the ingot, and when the pulling speed (P/S) of the ingot strongly decreases, the diameter (D) of the ingot increases rapidly (see S3, S4, and S1).

By repeating such a process, it is difficult to uniformly and accurately control the diameter (D) to the target diameter ($D_0$) at the beginning of the body process, and as shown in FIG. 3, as the length of the ingot grows at the beginning of the body process, it can be seen that the diameter error ($\Delta D$) increases from 1 mm to 4 mm or more.

In addition, the pulling speed (P/S) is controlled in proportion to the diameter error ($\Delta D$), and at the same time, a temperature (T) is controlled according to a pulling speed error ($\Delta P/S$), and since the temperature fluctuates more slowly than the pulling speed (P/S), temperature correction may be performed excessively and quality of the ingot may be deteriorated.

According to the related art as described above, since the diameter of the ingot may not be accurately controlled at the beginning of the body process, not only the diameter error is displayed large, but also the quality reproducibility is deteriorated, and there is a problem that the quality is deteriorated due to mutual complex factors such as melt gap fluctuation according to a difference in a residual amount of melt.

DISCLOSURE

Technical Problem

The present invention is directed to solving the above-described problems in the related art and providing a single crystal ingot growth control device capable of accurately controlling a diameter of an ingot even when a shouldering process is switched to a body process.

Technical Solution

The present invention provides a single crystal ingot growth control device applied to a body process for growing the diameter of an ingot to a target diameter, and the single crystal ingot growth control device includes: an input unit that receives a diameter error ($\Delta D$) that is a difference value between a measured diameter (D) of the ingot and a target diameter ($D_{\_T}$); a calculation unit that performs integral calculation on the diameter error ($\Delta D$) received by the input unit in real time and calculates a final pulling speed ($P/S_{\_F}$) for each set time (t) that is increased stepwise by reflecting the diameter error integral value ($\int \Delta D$), and an output unit that outputs the final pulling speed ($P/S_{\_F}$) calculated by the calculation unit to a pulling controller during the set time (t).

When the diameter error integral value ($\int \Delta D$) is positive or negative, the calculation unit may select to increase the set time (t) stepwise in proportion to the number of fluctuations in the diameter error integral value ($\int \Delta D$).

When the positive diameter error integral value ($\int \Delta D$) is continuously increased, the calculation unit may select a first set time (t1) increased stepwise, and when the negative diameter error ($\Delta D$) is continuously decreased, the calculation unit may select a second set time (t2) increased stepwise and may configure the second set time (t2) to be longer than the first set time (t1).

The calculation unit may calculate a first pulling speed error ($\Delta P/S_{\_1}$) of the ingot according to the diameter error integral value ($\int \Delta D$) and the selected set time (t) and may calculate the final pulling speed ($P/S_{\_F}$) by reflecting the first pulling speed error ($\Delta P/S_{\_1}$) in a target pulling speed ($P/S_{\_T}$) of the ingot.

The calculation unit may calculate a corrected pulling speed ($P/S_{\_A}$) by reflecting opposite to the target pulling speed ($P/S_{\_T}$) by as much as a ratio set arbitrarily within a range of 0 to 100% with respect to the first pulling speed error ($\Delta P/S_{\_1}$), and the output unit may continuously output the final pulling speed ($P/S_{\_F}$) and the corrected pulling speed ($P/S_{\_A}$) calculated by the calculation unit to the pulling controller.

It is preferred that the calculation unit calculates the corrected pulling speed ($P/S_{\_A}$) of the ingot by reflecting opposite to the target pulling speed ($P/S_{\_T}$) of the ingot by as much as a ratio of 40% with respect to the first pulling speed error ($\Delta P/S_{\_1}$).

The output unit may output the final pulling speed ($P/S_{\_F}$) during the set time (t), and may continuously output the corrected pulling speed ($P/S_{\_A}$) during the set time (t).

The calculation unit may calculate a temperature correction amount ($\Delta T$) by reflecting the diameter error ($\Delta D$) received by the input unit, and the output unit may output the temperature correction amount ($\Delta T$) calculated by the calculation unit to a heater.

The calculation unit may calculate a second pulling speed error ($\Delta P/S_{\_2}$) of the ingot by calculating the diameter error ($\Delta D$) by a proportional integral derivative (PID) and may calculate the temperature correction amount ($\Delta T$) according to the second pulling speed error ($\Delta P/S_{\_2}$).

Advantageous Effects

A single crystal ingot growth control device according to the present invention performs integral calculation on an input diameter error ($\Delta D$) by a time unit in real time, calculates a final pulling speed ($P/S_{\_F}$) for each set time (t) that is increased stepwise by reflecting a diameter error integral value ($\int \Delta D$), and then outputs the final pulling speed during the set time, and accordingly, it is possible to prevent excessive temperature correction, and to quickly implement a target diameter ($D\_T$).

In addition, a pulling speed error ($\Delta P/S$) is calculated according to the diameter error integral value ($\int \Delta D$) and the set time (t) selected for each step, and the final pulling speed ($P/S_{\_F}$) is output by reflecting the pulling speed error ($\Delta P/S$) in a pulling speed ($P/S_{\_T}$) set in consideration of the quality of the ingot, and accordingly, it is possible to stably and uniformly maintain the quality of the ingot even when the diameter is controlled.

In addition, it is possible to respond in advance to the tendency of the diameter to increase or decrease rapidly by continuously outputting the final pulling speed ($P/S_{\_F}$) and the corrected pulling speed ($P/S_{\_A}$) that have been increased or decreased based on the target pulling speed ($P/S_{\_T}$).

In addition, the temperature correction is performed in consideration of the fact that a temperature (T) fluctuates slowly compared to the pulling speed (P/S) by outputting a temperature correction amount ($\Delta T$) according to the PID calculation result of the diameter error ($\Delta D$), and accordingly, it is possible to prevent excessive temperature correction.

MODES OF THE INVENTION

Hereinafter, embodiments will be described in detail with reference to the accompanying drawings. However, the scope of the spirit of the present invention may be determined from the matters disclosed in the embodiments, and the spirit of the present invention of the embodiments include practical modifications such as addition, deletion, modification, and the like of components to the following proposed embodiments.

Figure 1A:
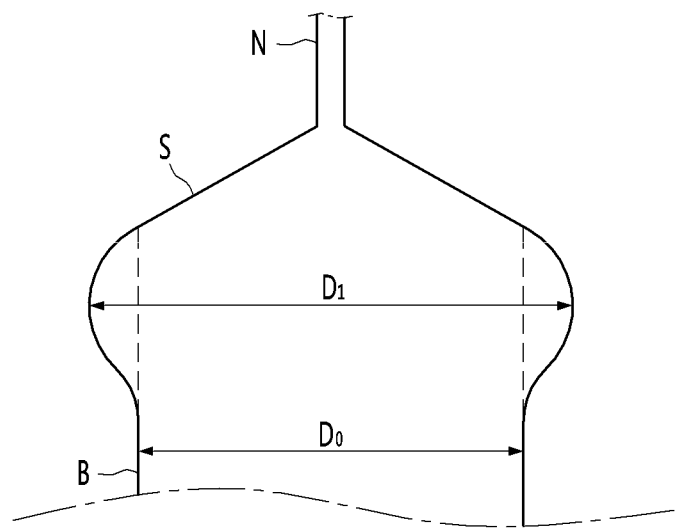
FIGS. 1A and 1B are views illustrating a growth state of a single crystal ingot at the beginning of a body process according to the related art.
Figure 1B:
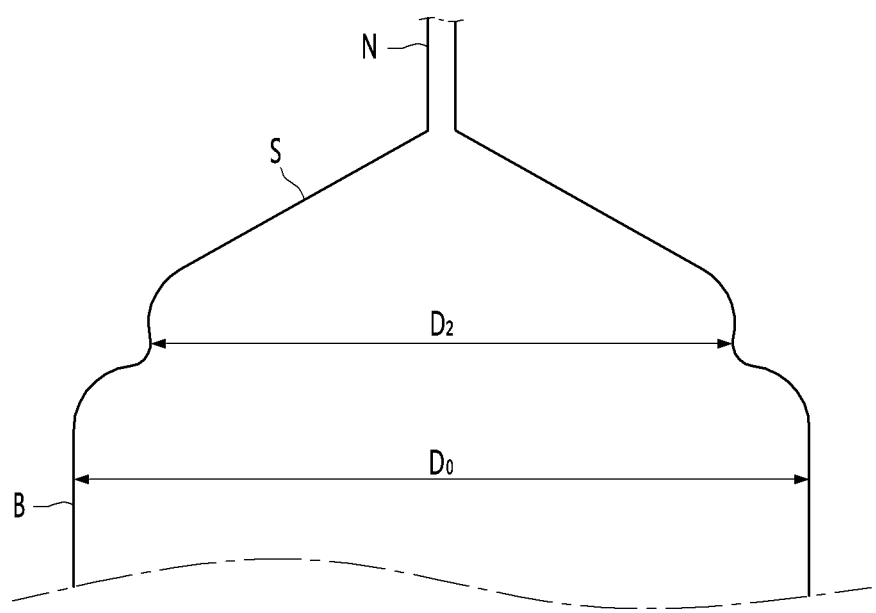
Figure 2:
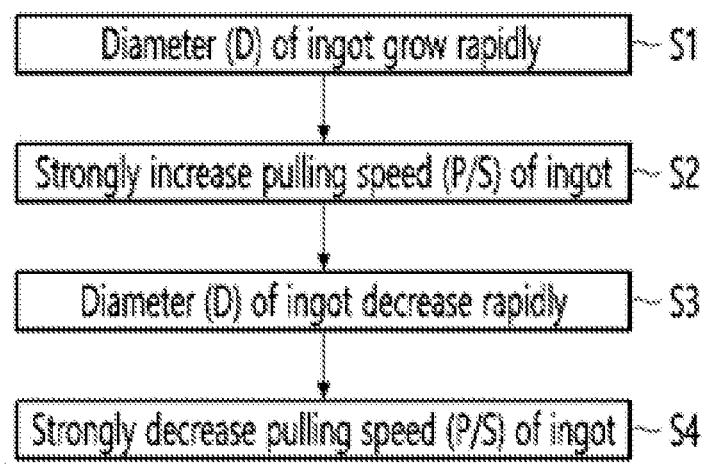
FIG. 2 is a flow chart illustrating an example a method of manufacturing a single crystal ingot according to the related art.
Figure 3:
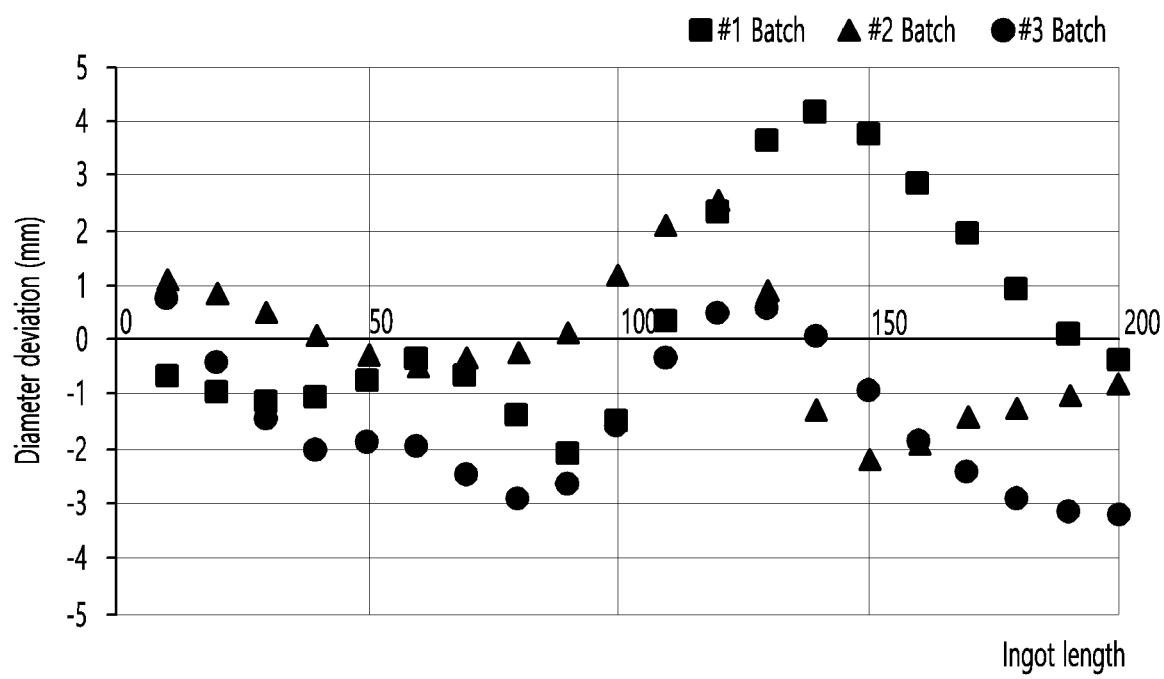
FIG. 3 is a graph illustrating a diameter error for each length of the single crystal ingot according to the related art.
Figure 4:
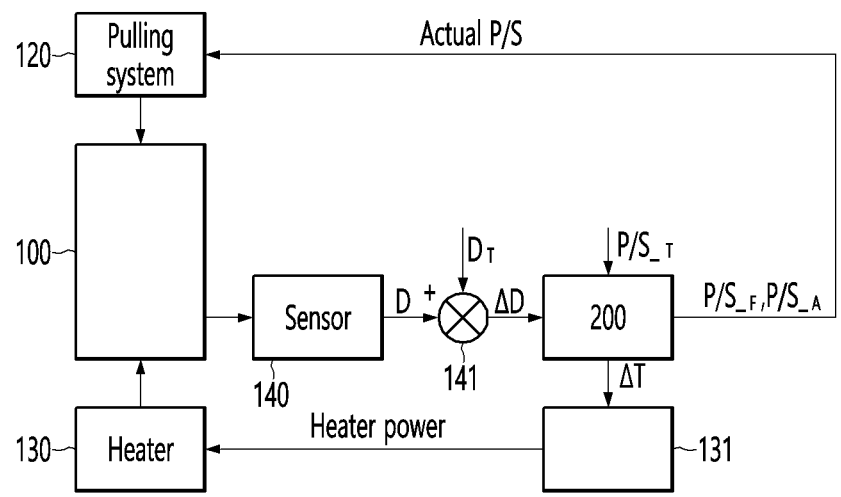
FIG. 4 is a configuration diagram illustrating an embodiment of a single crystal ingot growth apparatus according to the present invention.

FIG. 4 is a configuration diagram illustrating an embodiment of a single crystal ingot growth apparatus according to the present invention.

The single crystal ingot growth apparatus of the present invention, as shown in FIG. 4, includes a chamber 110 accommodating a crucible containing a silicon melt, a pulling system 120 for growing a single crystal ingot while dipping and pulling up a seed to the silicon melt, a heater 130 for heating the crucible, a diameter measuring sensor 140 for measuring a diameter of a single crystal, and a control device 200 for controlling operations of the pulling system 120 and the heater 130.

The diameter measuring sensor 140 measures the diameter of the ingot grown at a melt interface, and a diameter comparator 141 compares a measurement diameter (D) input from the diameter measuring sensor 140 with a target diameter (D_T) input separately to calculate a diameter error ($\Delta D$).

The control device 200 compares a result of performing integral calculation on the diameter error ($\Delta D$) input from the comparator 141 by a time unit in real time with a target pulling speed ($P/S_{\_T}$) input separately to calculate a final pulling speed ($P/S_{\_F}$) and a corrected pulling speed ($P/S_{\_A}$), and an operation of the pulling system 120 may be adjusted according to the final pulling speed ($P/S_{\_F}$) and the corrected pulling speed ($P/S_{\_A}$).

The control device 200 calculates a temperature correction amount ($\Delta T$) according to a result of calculating the diameter error ($\Delta D$) input from the comparator 141 by a proportional integral derivative (PID), and an automatic pulling controller (Auto Growth Controller) 131 may output heater power according to the temperature correction amount ($\Delta T$) to control an operation of the heater 130.

Figure 5:
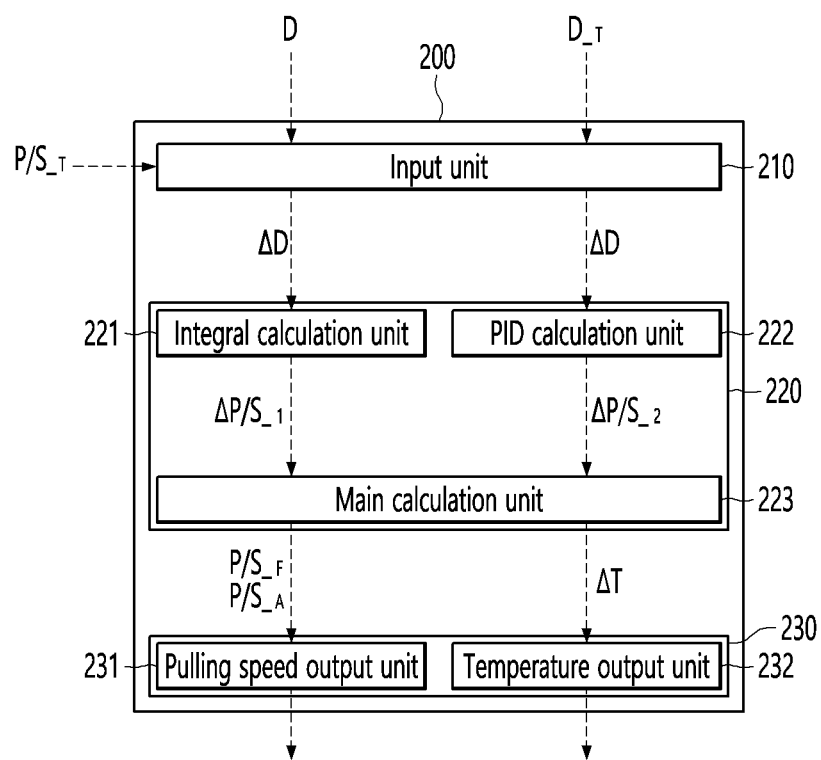
FIG. 5 is a configuration diagram illustrating an embodiment of a single crystal ingot growth control device according to the present invention.
Figure 6:
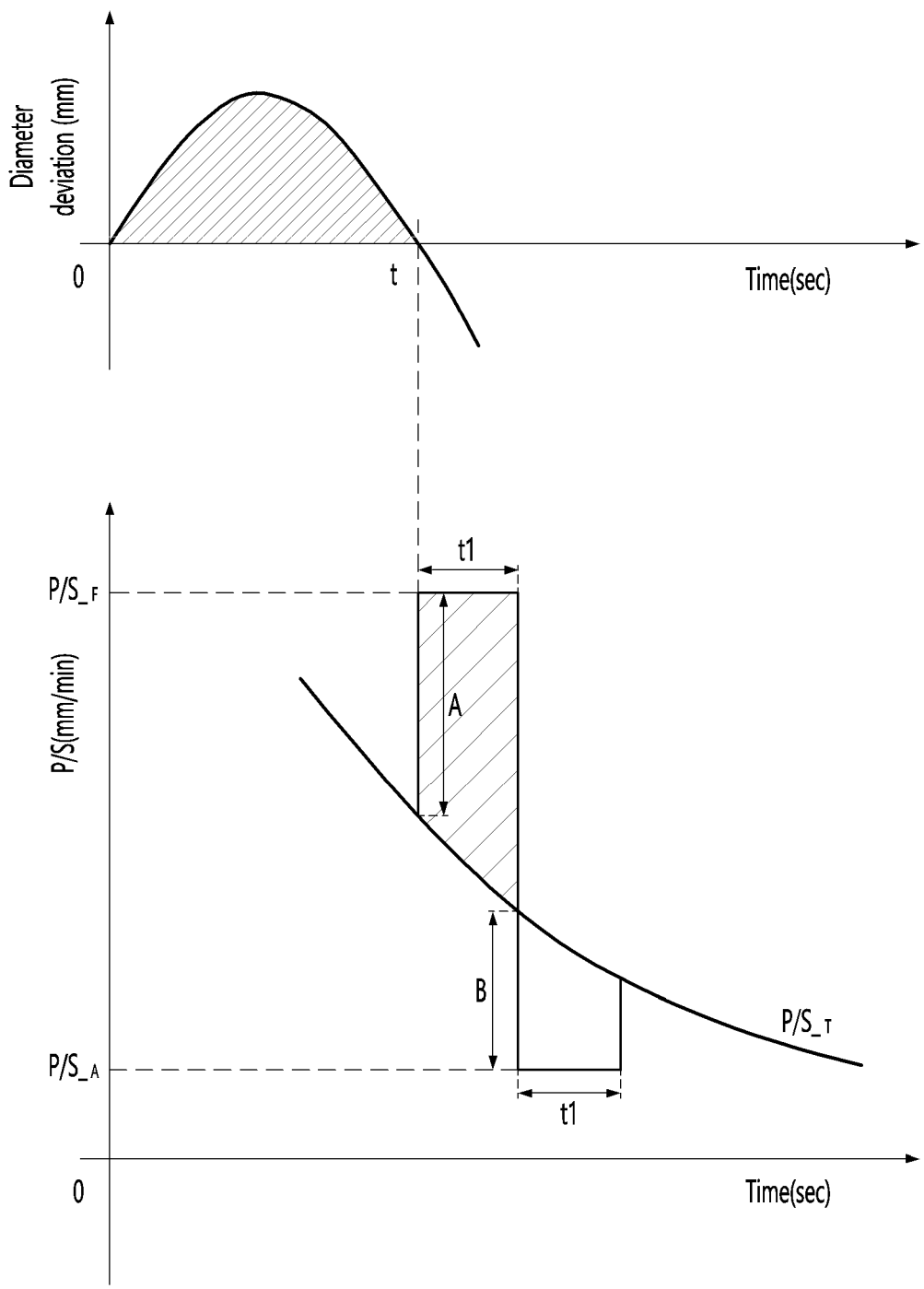
FIG. 6 is a graph illustrating an example of pulling speed control according to a diameter error for diameter control applied to the present invention.

FIG. 5 is a configuration diagram illustrating an embodiment of the single crystal ingot growth control device according to the present invention, and FIG. 6 is a graph illustrating an example of pulling speed control according to a diameter error for diameter control applied to the present invention.

As shown in FIG. 5, the control device 200 applied to the present invention includes an input unit 210 in which the diameter error ($\Delta D$), the target diameter (D_T), and the target pulling speed ($P/S_{\_T}$) are input as data, a calculation unit 220 that calculates the final pulling speed ($P/S_{\_F}$), the corrected pulling speed ($P/S_{\_A}$), and the temperature correction amount ($\Delta T$) by calculating the data input from the input unit 210, and an output unit 230 that outputs the final pulling speed ($P/S_{\_F}$), the corrected pulling speed ($P/S_{\_A}$), and the temperature correction amount ($\Delta T$) calculated from the calculation unit 220.

The input unit 210 receives the diameter error ($\Delta D$) from the diameter comparator 141 (shown in FIG. 4), at the same time, receives the target pulling speed ($P/S_{\_T}$) that is set separately, and may provide the diameter error ($\Delta D$) and the target pulling speed ($P/S_{\_T}$) to the calculation unit 220.

Of course, the input unit 210 may include the diameter comparator 141 (shown in FIG. 4) described above, but the present invention is not limited thereto.

The calculation unit 220 may include an integral calculation unit 221 that performs integral calculation on the diameter error ($\Delta D$) by a time unit in real time, a PID calculation unit 222 that proportionally integrates and differentiates the diameter error ($\Delta D$) in real time, and a main calculation unit 223 that calculates the final pulling speed ($P/S_{\_F}$) and the corrected pulling speed ($P/S_{\_A}$) according to the calculation result of the integral calculation unit 221 and calculates the temperature correction amount ($\Delta T$) according to the calculation result of the PID calculation unit 222.

The main calculation unit 223 calculates the final pulling speed ($P/S_{\_F}$) for each set time (t) that is increased stepwise by reflecting a diameter error integral value ($\int\Delta D$) that is the calculation result of the integral calculation unit 221, and may select to increase the set time (t) stepwise in proportion to the number of fluctuations in the diameter error integral value ($\int\Delta D$) as shown in [Table 2] below.

TABLE 2

| Increase of positive diameter error integral value ($\int\Delta D$) | | Decrease of negative diameter error integral value ($\int\Delta D$) | |
|---|---|---|---|
| step | First set time (t1, sec) | Step | Second set time (t2, sec) |
| 6 | 35 | 6 | 60 |
| 5 | 30 | 5 | 50 |
| 4 | 25 | 4 | 40 |
| 3 | 20 | 3 | 30 |
| 2 | 15 | 2 | 20 |
| 1 | 10 | 1 | 10 |

When the diameter error integral value ($\int\Delta D$) is positive (+), the first set time (t1) that is increased stepwise in five second intervals in proportion to the number of times the diameter error integral value ($\int\Delta D$) calculated in real time increases may be selected, and a first pulling speed error ($\Delta P/S_{\_1}$) of the ingot may be calculated according to the positive (+) diameter error integral value ($\int\Delta D$) and the selected first set time (t1). When the diameter error integral value ($\int\Delta D$) is negative (−), the second set time (t2) that is increased stepwise in ten second intervals in proportion to the number of times the diameter error integral value ($\int\Delta D$) calculated in real time decreases may be selected, and the first pulling speed error ($\Delta P/S_{\_1}$) of the ingot may be calculated according to the negative (−) diameter error integral value ($\int\Delta D$) and the selected second set time (t2).

However, the pulling speed (P/S) is all positive numbers, a range when the pulling speed (P/S) is lower than the target pulling speed ($\Delta P/S_{\_T}$) is relatively smaller than a range when the pulling speed (P/S) is higher than the target pulling speed ($\Delta P/S_{\_T}$), and thus, there is a limit to lowering the pulling speed (P/S).

Therefore, it is preferable that the second set time (t2) selected according to the negative (−) diameter error integral value ($\int\Delta D$) is set longer than the first set time (t1) selected according to the positive (+) diameter error integral value ($\int\Delta D$).

As described above, the final pulling speed ($P/S_{\_F}$) may be calculated by reflecting the first pulling speed error ($\Delta P/S_{\_1}$) calculated in consideration of the set times (t1 and t2) in the target pulling speed ($P/S_{\_T}$) of the ingot.

As shown in FIG. 5, the final pulling speed ($P/S_{\_F}$) may be calculated by adding the first pulling speed error ($\Delta P/S_{\_1}$=A) to the target pulling speed ($\Delta P/S_{\_T}$) so that an area of the first pulling speed error ($\Delta P/S_{\_1}$) according to the first set time (t1) is equally implemented to an area of the diameter error ($\Delta D$) according to the time (t).

In addition, the corrected pulling speed ($P/S_{\_A}$) may be calculated by reflecting a set ratio within a range of 0 to 100% with respect to the first pulling speed error ($\Delta P/S_{\_1}$), and the corrected pulling speed ($P/S_{\_A}$) may be calculated by subtracting a 40% ratio (B) of the first pulling speed error ($\Delta P/S_{\_1}$) from the target pulling speed ($P/S_{\_T}$).

Of course, when the first pulling speed error ($\Delta P/S_{\_1}$) is positive (+), the final pulling speed ($P/S_{\_F}$) is calculated to be greater larger than the target pulling speed ($P/S_{\_T}$), and the corrected pulling speed ($P/S_A$) is calculated smaller than the target pulling speed ($P/S_T$).

On the other hand, when the first pulling speed error ($\Delta P/S_{-1}$) is negative (−), the final pulling speed ($P/S_F$) is calculated smaller than the target pulling speed ($P/S_T$), and the corrected pulling speed ($P/S_A$) is calculated to be larger than the target pulling speed ($P/S_T$).

The main calculation unit 223 may calculate a second pulling speed error ($\Delta P/S_{-2}$) according to a proportional integral differential value of the diameter error ($\Delta D$) that is the calculation result of the PID calculation unit 222 and calculate the temperature correction amount ($\Delta T$) according to the second pulling speed error ($\Delta P/S_{-2}$).

The output unit 230 may include a pulling speed output unit 231 for outputting the final pulling speed ($P/S_F$) and the corrected pulling speed ($P/S_A$), and a temperature output unit 232 for outputting the temperature correction amount ($\Delta T$).

The pulling speed output unit 231 may output the final pulling speed ($P/S_F$) and the corrected pulling speed ($P/S_A$) that are calculated by the calculation unit 220 to the pulling system 120 (shown in FIG. 4), may output the final pulling speed ($P/S_F$) by as much as the set time (t) selected from the calculation unit 220, and may continuously output the corrected pulling speed ($P/S_A$) by as much as the selected set time (t).

That is, the final pulling speed ($P/S_F$) is sequentially output according to the set time (t) increased stepwise, and accordingly, it is possible to prevent excessive diameter correction, and to quickly implement the target diameter (D_T).

In addition, the final pulling speed ($P/S_F$) reflects the target pulling speed ($P/S_T$), and the quality of the ingot may be stably and uniformly maintained.

In addition, it is possible to respond in advance to the tendency of the diameter to increase or decrease rapidly by continuously outputting the final pulling speed ($P/S_F$) and the corrected pulling speed ($P/S_A$) that have been increased or decreased based on the target pulling speed ($P/S_T$).

The temperature output unit 232 may convert the temperature correction amount ($\Delta T$) calculated by the calculation unit 220 into heater power and output it to the heater 130 (shown in FIG. 4), and the temperature output unit 232 may include the automatic pulling controller 131 (shown in FIG. 4) described above.

When considering that a temperature (T) fluctuates slowly compared to the pulling speed (P/S), it is possible to prevent excessive temperature correction by correcting the temperature T according to the PID calculation result separately from the pulling speed correction.

Figure 7:
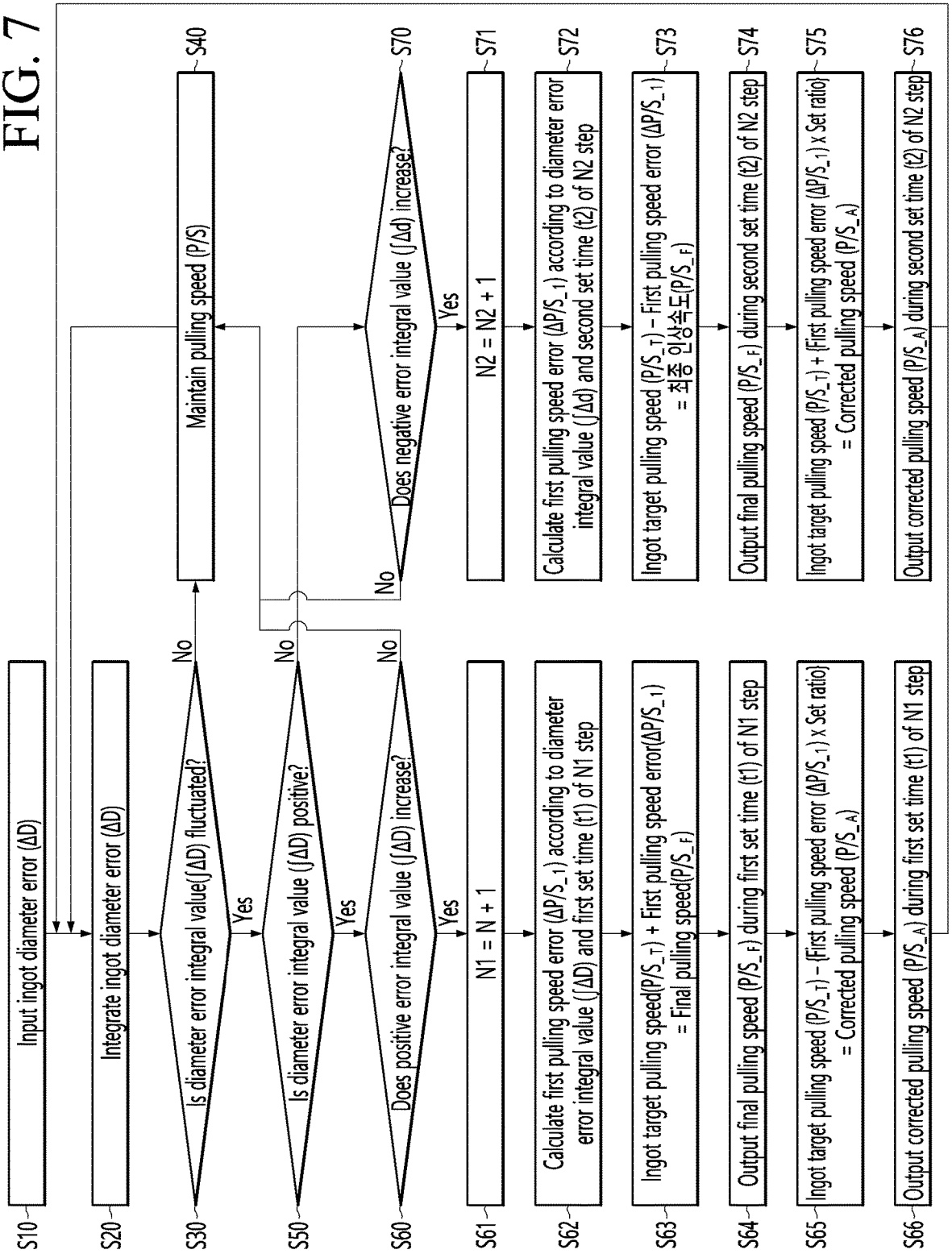
FIG. 7 is a flow chart illustrating an example of diameter control applied to the present invention.
Figure 8:
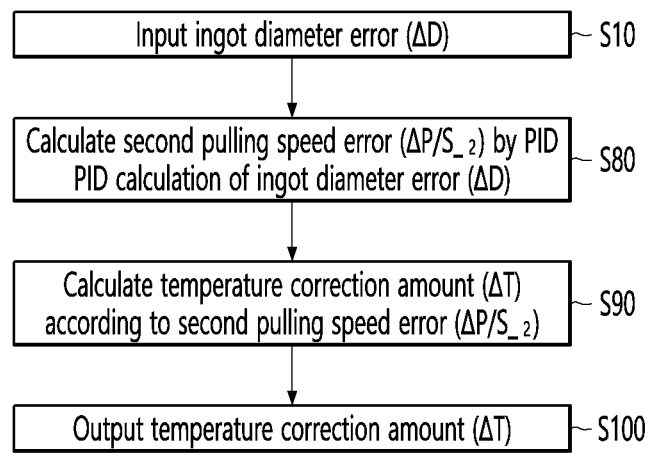
FIG. 8 is a flowchart illustrating an example of temperature control applied to the present invention.

FIG. 7 is a flowchart illustrating an example of diameter control applied to the present invention, and FIG. 8 is a flowchart illustrating an example of temperature control applied to the present invention.

A method of controlling the diameter of the ingot applied to the present invention receives the diameter error ($\Delta D$) as shown in FIG. 7 and integrates the diameter error ($\Delta D$) by a time unit in real time. (see S10 and S20)

When the diameter error integral value ($\int \Delta D$) is not fluctuated by determining whether the diameter error integral value ($\int \Delta D$) is fluctuated, the pulling speed (P/S) is maintained as it is. (see S30 and S40)

When the diameter error integral value ($\int \Delta D$) is fluctuated, it is determined whether the diameter error integral value ($\int \Delta D$) is positive. (see S40 and S50)

When the diameter error integral value ($\int \Delta D$) is positive, it is determined whether the positive diameter error integral value ($\int \Delta D$) increases. (see S50 and S60)

When the positive diameter error integral value ($\int \Delta D$) does not increase, the pulling speed (P/S) is maintained as it is. (see S60 and S40)

When the positive diameter error integral value ($\int \Delta D$) increases, the number of times (N1) that the diameter error integral value ($\int \Delta D$) has continuously increased is counted to select an increment step (N1). (see S60 and S61)

The first pulling speed error ($\Delta P/S_{-1}$) is calculated according to the diameter error integral value ($\int \Delta D$) and the first set time (t1) of the selected increment step (N1), and after the final pulling speed ($P/S_F$) that is a value obtained by adding the target pulling speed ($P/S_T$) and the first pulling speed error ($\Delta P/S_{-1}$) is calculated, the final pulling speed ($P/S_F$) is output during the first set time (t1). (see S62, S63, and S64)

It is possible to prevent an excessive diameter correction and quickly implement the target diameter (D_T) by sequentially outputting the final pulling speed ($P/S_F$) calculated according to the increment step (N1) according to the first set time (t1) increased stepwise.

In addition, the final pulling speed ($P/S_F$) reflects the target pulling speed ($P/S_T$), and the quality of the ingot may be stably and uniformly maintained.

Thereafter, after calculating the corrected pulling speed ($P/S_A$) that is a value obtained by subtracting the first pulling speed error ($\Delta P/S_{-1}$) by as much as the set ratio from the target pulling speed ($P/S_T$), the corrected pulling speed ($P/S_A$) is output during the first set time (t1) (see S65 and S66).

It is possible to respond in advance to the tendency of the diameter to decrease rapidly by continuously providing the final pulling speed ($P/S_F$) higher than the target pulling speed ($P/S_T$) and the corrected pulling speed ($P/S_A$) lower than the target pulling speed ($P/S_T$).

Meanwhile, when the diameter error integral value ($\int \Delta D$) is negative, it is determined whether the negative diameter error integral value ($\int \Delta D$) decreases. (see S50 and S70)

When the negative diameter error integral value ($\int \Delta D$) does not increase, the pulling speed (P/S) is maintained as it is. (see S70 and S40)

When the negative diameter error integral value ($\int \Delta D$) decreases, the number of times (N2) that the diameter error integral value ($\int \Delta D$) has continuously decreased is counted to select a decrement step (N2). (see S70, S71)

The first pulling speed error ($\Delta P/S_{-1}$) is calculated according to the diameter error integral value ($\int \Delta D$) and the second set time t2 of the selected decrement step (N2), and after the final pulling speed ($P/S_F$) that is a value obtained by subtracting the target pulling speed ($P/S_T$) and the first pulling speed error ($\Delta P/S_{-1}$) is calculated, the final pulling speed ($P/S_F$) is output during the second set time (t2). (see S72, S73, and S74)

It is possible to prevent an excessive diameter correction and quickly implement the target diameter (D_T) by sequentially outputting the final pulling speed ($P/S_F$) calculated according to the decrement step (N2) according to the second set time (t2) increased stepwise.

Similarly, the final pulling speed ($P/S_F$) reflects the target pulling speed ($P/S_T$), and the quality of the ingot may be stably and uniformly maintained.

Thereafter, after calculating the corrected pulling speed ($P/S_A$) that is a value obtained by adding the first pulling speed error ($\Delta P/S_{-1}$) by as much as the set ratio from the target pulling speed ($P/S_{\_T}$), the corrected pulling speed ($P/S_{\_A}$) is output during the second set time t2. (see S75 and S76)

It is possible to respond in advance to the tendency of the diameter to increase rapidly by continuously providing the final pulling speed ($P/S_{\_F}$) lower than the target pulling speed ($P/S_{\_T}$) and the corrected pulling speed ($P/S_{\_A}$) higher than the target pulling speed ($P/S_{\_T}$).

When the diameter error ($\Delta D$) is largely generated at the beginning of the body process while repeating the above process, the diameter error ($\Delta D$) may be reduced quickly and accurately by maintaining the pulling speed (P/S) sufficiently fluctuated during a time (t) increased stepwise.

However, the pulling speed (P/S) is corrected in order to reduce the diameter error ($\Delta D$) at the beginning of the body process, and when the temperature (T) is corrected according to the pulling speed (P/S) as in the related art, excessive temperature correction may be performed.

Therefore, a method of controlling the temperature applied to the present invention receives the diameter error ($\Delta D$) as shown in FIG. 8 and calculates the second pulling speed error ($\Delta P/S_{\_2}$) by PID calculation of the diameter error ($\Delta D$). (see S10 and S80)

The second pulling speed error ($\Delta P/S_{\_2}$) obtained by PID calculation of the diameter error ($\Delta D$) is shown to be relatively smaller than the first pulling speed error ($\Delta P/S_{\_1}$) obtained by integral calculation of the diameter error ($\Delta D$).

Thereafter, the temperature correction amount ($\Delta T$) is calculated according to the second pulling speed error ($\Delta P/S_{\_2}$), and then the temperature correction amount ($\Delta T$) is output. (see S90 and S100)

When considering that the temperature (T) fluctuates slowly compared to the pulling speed (P/S), it is possible to prevent excessive temperature correction by correcting the temperature (T) according to the second pulling speed error ($\Delta P/S_{\_2}$) relatively smaller than the first pulling speed error ($\Delta P/S_{\_1}$).

Figure 9:
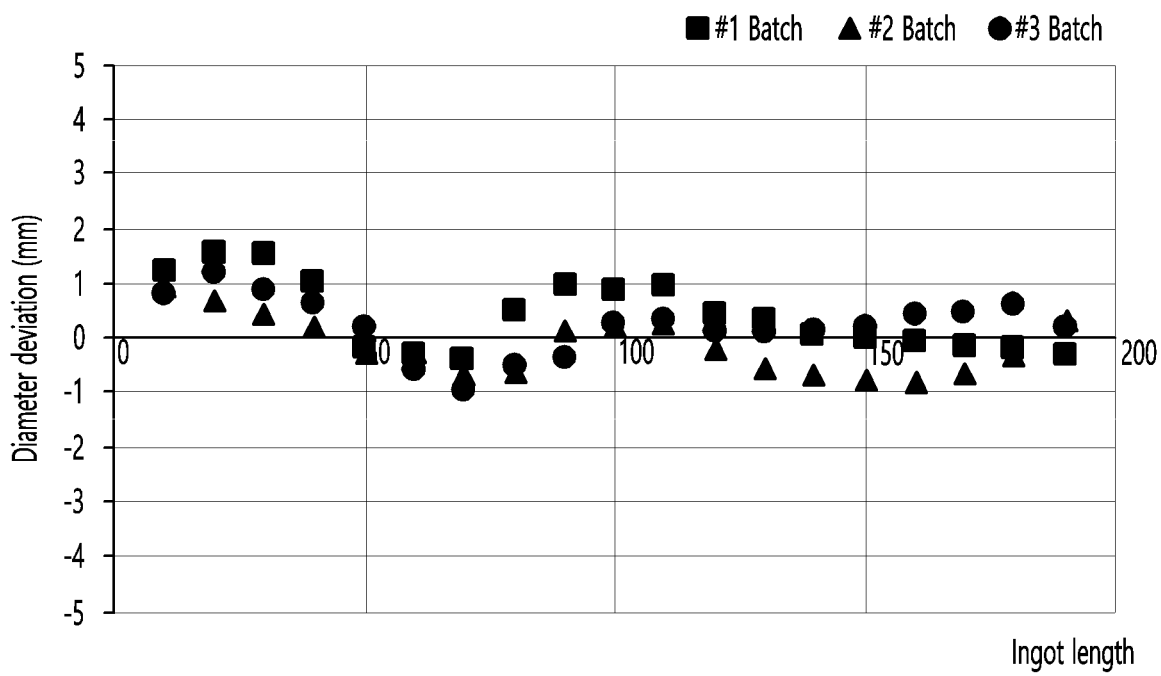
FIG. 9 is a graph illustrating a diameter error for each length of the single crystal ingot according to the present invention.
Figure 10:
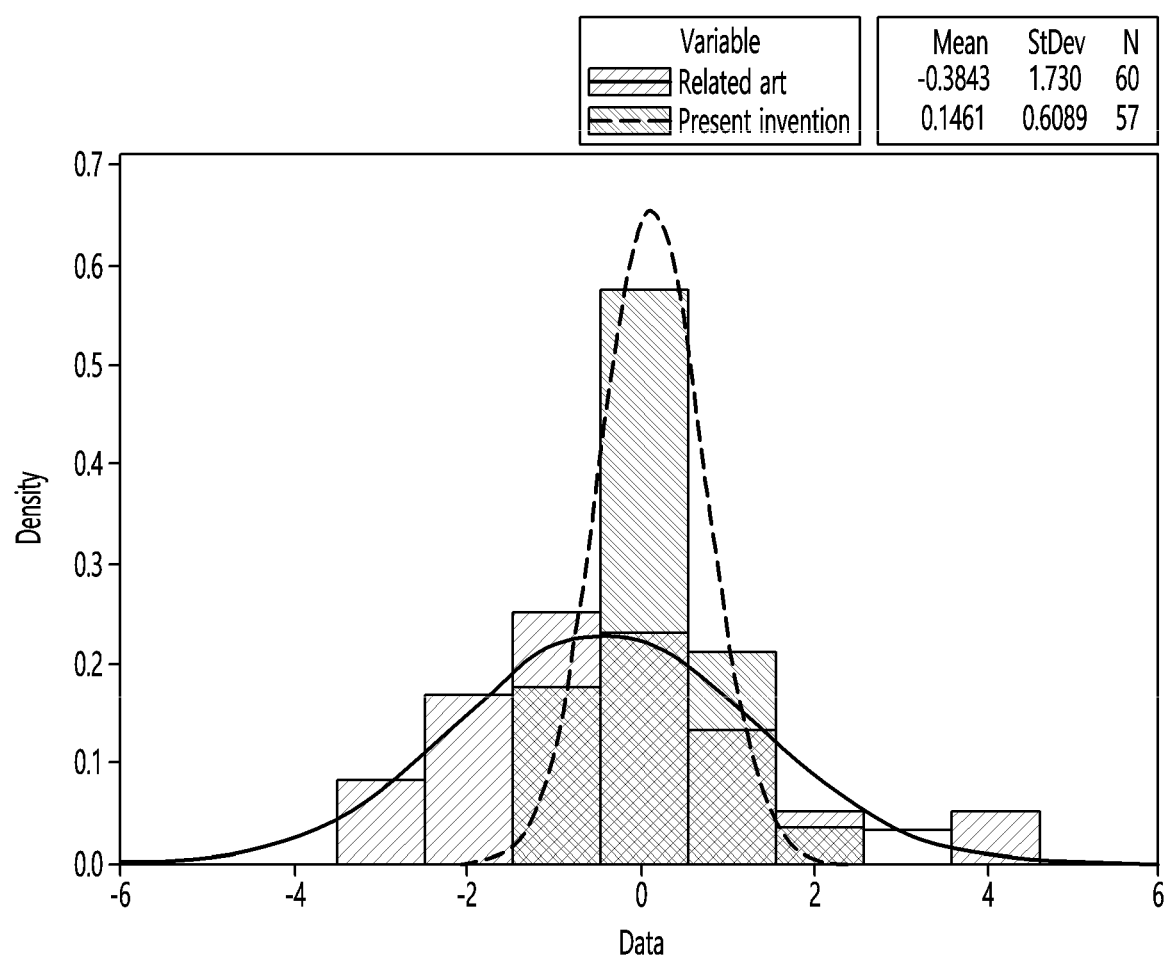
FIG. 10 is a graph illustrating a diameter error deviation at the beginning of a body process according to the related art and the present invention.

FIG. 9 is a graph illustrating a diameter error for each length of the single crystal ingot according to the present invention, and FIG. 10 is a graph illustrating a diameter error deviation at the beginning of the body process according to the related art and the present invention.

The present invention selects the set time (t) that is increased stepwise according to the diameter error integral value ($\int \Delta D$) in time units at the beginning of the body process, and simultaneously, calculates the pulling speed error ($\Delta P/S$), and the final pulling speed ($P/S_{\_F}$) that reflects the pulling speed error ($\Delta P/S$) in the target pulling speed ($P/SZ_{\_T}$) is output during the set time (t), and then the corrected pulling speed ($P/S_{\_A}$) reflecting opposite to the target pulling speed ($P/S_{\_T}$) by as much as the set ratio of the pulling speed error ($\Delta P/S$) is output during the set time (t).

As shown in FIG. 9, it can be confirmed that as the single crystal ingot manufactured by the present invention grows in the longitudinal direction, the diameter error ($\Delta D$) gradually decreases within 2 mm.

As shown in FIG. 10, the diameter error deviation ($\Delta D$ St.dev-) of the single crystal ingot manufactured by the related art is shown in 1.73, whereas the diameter error deviation ($\Delta D$ St.dev) of the single crystal ingot manufactured by the present invention is 0.61, which is an improvement of about 65% as compared with the related art.

INDUSTRIAL APPLICABILITY

This embodiment can be applied to a single crystal ingot growth control device for manufacturing a single crystal ingot.

The invention claimed is:

1. A single crystal ingot growth apparatus comprising:
a single crystal ingot growth control device comprising:
an input unit that is configured to receive a diameter error that is a difference value between a measured diameter of a single crystal ingot and a target diameter;
a calculation unit that is configured to perform integral calculation on the diameter error received by the input unit in real time and configured to calculate a final pulling speed for each set time that is increased stepwise by reflecting the diameter error integral value; and
an output unit that is configured to output the final pulling speed calculated by the calculation unit to a pulling controller during the set time,
wherein,
when the diameter error integral value is positive or negative, the calculation unit selects to increase the set time stepwise in proportion to the number of fluctuations in the diameter error integral value,
when the positive diameter error integral value is continuously increased, the calculation unit selects a first set time increased stepwise, and
when the negative diameter error is continuously decreased, the calculation unit selects a second set time increased stepwise, the second set time being longer than the first set time.

2. The single crystal ingot growth control apparatus of claim 1, wherein the calculation unit is configured to calculate a first pulling speed error of the ingot according to the diameter error integral value and the selected set time and configured to calculate the final pulling speed by reflecting the first pulling speed error in a target pulling speed of the ingot.

3. The single crystal ingot growth control apparatus of claim 2, wherein the calculation unit is configured to calculate a corrected pulling speed by reflecting opposite to the target pulling speed by as much as a ratio set arbitrarily within a range of 0 to 100% with respect to the first pulling speed error, and
the output unit continuously is configured to output the final pulling speed and the corrected pulling speed calculated by the calculation unit to the pulling controller.

4. The single crystal ingot growth control apparatus of claim 3, wherein the calculation unit is configured to calculate the corrected pulling speed of the ingot by reflecting opposite to the target pulling speed of the ingot by as much as a ratio of 40% with respect to the first pulling speed error.

5. The single crystal ingot growth control apparatus of claim 3, wherein the output unit is configured to output the final pulling speed during the set time, and continuously outputs the corrected pulling speed during the set time.

6. The single crystal ingot growth control apparatus of claim 1, wherein the calculation unit is configured to calculate a temperature correction amount by reflecting the diameter error received by the input unit, and
the output unit is configured to output the temperature correction amount calculated by the calculation unit to a heater.

7. The single crystal ingot growth control apparatus of claim 6, wherein the calculation unit is configured to calculate a second pulling speed error of the ingot by calculating the diameter error by a proportional integral derivative and configured to calculate the temperature correction amount according to the second pulling speed error.

8. The single crystal ingot growth control apparatus of claim 1 further comprises:

a chamber accommodating a crucible containing a silicon melt;
a pulling system configured to grow the single crystal ingot by dipping and pulling up a seed to the silicon melt;
a heater configured to heat the crucible; and
a diameter measuring sensor configured to measure a diameter of the single crystal ingot.

* * * * *